(12) United States Patent
Cheung et al.

(10) Patent No.: US 9,036,354 B2
(45) Date of Patent: May 19, 2015

(54) HEAT SINK THERMAL PRESS FOR PHASE CHANGE HEAT SINK MATERIAL

(71) Applicant: Flextronics AP, LLC, Broomfield, CO (US)

(72) Inventors: Dason Cheung, Fremont, CA (US); Murad Kurwa, San Jose, CA (US); Richard Loi, San Jose, CA (US)

(73) Assignee: Flextronics, AP, LLC, Broomfield, CO (US)

( * ) Notice: Subject to any disclaimer, the term of this patent is extended or adjusted under 35 U.S.C. 154(b) by 216 days.

(21) Appl. No.: 13/742,208

(22) Filed: Jan. 15, 2013

(65) Prior Publication Data
US 2014/0196879 A1 Jul. 17, 2014

(51) Int. Cl.
| | |
|---|---|
| *H05K 3/00* | (2006.01) |
| *B23P 15/26* | (2006.01) |
| *F28F 7/00* | (2006.01) |
| *G05B 19/02* | (2006.01) |
| *H01L 21/48* | (2006.01) |
| *H05K 13/00* | (2006.01) |
| *H05K 13/04* | (2006.01) |
| *H05K 1/02* | (2006.01) |

(52) U.S. Cl.
CPC . *F28F 7/00* (2013.01); *G05B 19/02* (2013.01); *Y10T 29/4935* (2015.01); *H01L 21/4882* (2013.01); *H05K 1/0209* (2013.01); *H05K 13/00* (2013.01); *H05K 2201/066* (2013.01); *H05K 2201/09781* (2013.01)

(58) Field of Classification Search
CPC ... H05K 3/00; H05K 13/046; H05K 13/0413; H05K 13/0486; H05K 7/20; H01L 24/80; H01L 21/4882; B23P 15/26; B23K 31/02
USPC ............ 361/679.46, 679.54, 704–712, 715, 361/719–724; 29/557, 558, 726, 727, 739, 29/890.03, 890.05, 890.033, 559; 228/6.2, 228/12, 44.7, 46, 212, 49.5, 103, 105, 200, 228/219, 213, 22, 254; 156/379, 538
See application file for complete search history.

(56) References Cited

U.S. PATENT DOCUMENTS

| | | | | |
|---|---|---|---|---|
| 3,791,018 | A * | 2/1974 | Johnston et al. | 228/180.1 |
| 3,840,978 | A * | 10/1974 | Lynch et al. | 228/110.1 |
| 4,166,562 | A * | 9/1979 | Keizer et al. | 228/5.1 |
| 4,295,596 | A * | 10/1981 | Doten et al. | 228/180.21 |
| 4,300,715 | A * | 11/1981 | Keizer et al. | 228/180.21 |
| 4,320,865 | A * | 3/1982 | Batinovich | 228/6.2 |
| 4,696,096 | A * | 9/1987 | Green et al. | 29/829 |

(Continued)

FOREIGN PATENT DOCUMENTS

JP 405206342 A * 8/1993 ............. H01L 23/40

*Primary Examiner* — Michail V Datskovskiy
(74) *Attorney, Agent, or Firm* — Haverstock & Owens LLP

(57) ABSTRACT

Methods of and apparatuses for electronic board assembly are provided. The apparatus can comprises one or more thermal heads controlled by a programmable logic controller. A user is able to enter the controlling parameters into the programmable logic controller through an human operator interface. The thermal heads are able to be connected with one or more pneumatic solenoid to make the thermal heads moving vertically until the thermal head in contact with the heat sink. The thermal head is able to provide a temperature, at or above the operating temperature of the thermal pad, capable of making the phase change thermal interface material to bond the heat sink and the electronic boards.

16 Claims, 7 Drawing Sheets

(56) References Cited

U.S. PATENT DOCUMENTS

| | | | |
|---|---|---|---|
| 4,972,990 A * | 11/1990 | Abbagnaro et al. | 228/20.1 |
| 5,086,559 A * | 2/1992 | Akatsuchi | 29/834 |
| 5,172,468 A * | 12/1992 | Tanaka et al. | 29/721 |
| 5,854,745 A * | 12/1998 | Muraoka et al. | 700/58 |
| 6,317,972 B1 * | 11/2001 | Asai et al. | 29/833 |
| 6,408,507 B1 * | 6/2002 | Goh | 29/832 |
| 6,550,668 B2 * | 4/2003 | Costa | 228/212 |
| 6,581,817 B2 * | 6/2003 | Kawashima et al. | 228/6.2 |
| 7,007,377 B2 * | 3/2006 | Noda et al. | 29/833 |
| 7,020,953 B2 * | 4/2006 | Ueno et al. | 29/740 |
| 7,216,421 B2 * | 5/2007 | Fu | 29/761 |
| 7,337,939 B2 * | 3/2008 | Terada et al. | 228/102 |
| 2009/0300903 A1 * | 12/2009 | Yang | 29/726 |

* cited by examiner

HEAT SINK THERMAL PRESS FOR PHASE CHANGE HEAT SINK MATERIAL

FIELD OF THE INVENTION

The present invention relates to the processes and apparatus for electronic device assembly. More particularly, the present invention relates to the devices for and methods of assembling heat sinks to electronic boards.

BACKGROUND

A typical heat sink assembling process using a phase change material as thermal transfer interface requires sending a whole assembly unit to an oven and heating up the whole assembly unit, such that the heat sink and/or other electronic components are able to be bonded to the computer chips and/or PCB (Printed Circuit Board). It is wasteful of energy to heat up the whole assembly unit. Further, thermo-expansion that results from heating the whole assembly can cause alignment and positioning problems of computer chips on the circuit board.

SUMMARY OF THE INVENTION

Methods of and apparatuses for electronic board assembly are disclosed herein. In a first aspect, an apparatus for assembling a heat sink comprises a movable thermal head and a user controlled unit configured to control the thermal head. In some embodiments, the thermal head mechanically couples with a pneumatic cylinder, such that the thermal head is able to move in a vertical direction. In other embodiments, the thermal head comprises a heating element, a thermal insulation element, or a combination thereof. In some other embodiments, the user controlled unit comprises a graphical user interface. In some embodiments, the user controlled unit is able to control the temperature of the thermal head to be maintained at a user defined temperature. In other embodiments, the user controlled unit is able to control a heating duration of the thermal head when the thermal head is in contact with a heat sink. In some other embodiments, the apparatus further comprises an assembly platform. In some embodiments, the thermal head is configured to move in a direction perpendicular to the surface of the assembling platform. In other embodiments, the assembly platform comprises a thermal head holding structure. In some other embodiments, the thermal head holding structure allows the thermal head to be positioned in any of the locations on the surface of the assembly platform. In some embodiments, the thermal head holding structure comprises an adjustable arm configured to move the thermal head in a first direction. In other embodiments, the thermal head holding structure comprises a support structure supporting the adjustable arm allowing the adjustable arm to move in a second direction perpendicular to the first direction. In some other embodiments, the assembly platform comprises one or more start buttons. In some embodiments, the assembly platform comprises a pressure regulator. In other embodiments, the assembly platform comprises a pressure gauge. In some other embodiments, the assembly platform comprises an emergency shut-off switch.

In a second aspect, a method of assembling an electronic device comprises heating a first thermal head, heating a heat sink and a thermal pad above a pre-determined temperature via the first thermal head, and attaching the heat sink to an electronic circuit board via the thermal pad. In some embodiments, the first thermal head has a contact surface substantially equal to the heat sink. In other embodiments, the first thermal head has a contact surface larger than the heat sink and smaller than the electronic circuit board. In some other embodiments, heating a thermal head comprises heating to a temperature above 64° C. In some embodiments, the method further comprises a user controlled unit. In other embodiments, the user controlled unit comprises a graphical user interface. In some other embodiments, the user controlled unit is able to control a movement of the first thermal head through the graphical user interface. In some embodiments, the method further comprises a second thermal head configured to perform an action independent from an action performed by the first thermal head.

In a third aspect, a controlling unit for a heat sink assembling apparatus comprises a graphical user interface, a programmable logic controller configured to receive information through the graphical user interface, a pneumatic cylinder controlled by the programmable logic controller, and a thermal head mechanically coupling with the pneumatic cylinder, wherein the thermal head comprises a heating element controlled by the programmable logic controller.

In some embodiments, the programmable logic controller comprises one or more temperature setting units. In other embodiments, the programmable logic controller comprises one or more time setting units. In some other embodiments, the programmable logic controller comprises one or more cylinder controlling units. In some embodiments, the one or more cylinder controlling units are operated manually through the graphical user interface. In other embodiments, the one or more cylinder controlling units are configured to move the thermal head vertically. In some other embodiments, the programmable logic controller comprises one or more idle time setting units.

Other features and advantages of the present invention will become apparent after reviewing the detailed description of the embodiments set forth below.

BRIEF DESCRIPTION OF THE DRAWINGS

The accompanying drawings, which are incorporated in and form a part of this specification, illustrate embodiments of the invention and, together with the description, serve to explain the principles of the invention, but not limit the invention to the disclosed examples.

The present invention is described relative to the several views of the drawings. Where appropriate and only where identical elements are disclosed and shown in more than one drawing, the same reference numeral will be used to represent such identical elements.

DETAILED DESCRIPTION OF THE PRESENT INVENTION

Reference will now be made in detail to the embodiments of the heat sink assembling method and apparatus of the invention, examples of which are illustrated in the accompanying drawings. While the invention will be described in conjunction with the embodiments below, it will be understood that they are not intended to limit the invention to these embodiments and examples. On the contrary, the invention is intended to cover alternatives, modifications and equivalents, which can be included within the spirit and scope of the invention as defined by the appended claims. Furthermore, in the following detailed description of the present invention, numerous specific details are set forth in order to more fully illustrate the present invention. However, it will be apparent to one of ordinary skill in the prior art having the benefit of this disclosure that the present invention can be practiced without these specific details. In other instances, well-known methods and procedures, components and processes haven not been described in detail so as not to unnecessarily obscure aspects of the present invention. It will, of course, be appreciated that in the development of any such actual implementation, numerous implementation-specific decisions must be made in order to achieve the developer's specific goals, such as compliance with application and business related constraints, and that these specific goals can vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
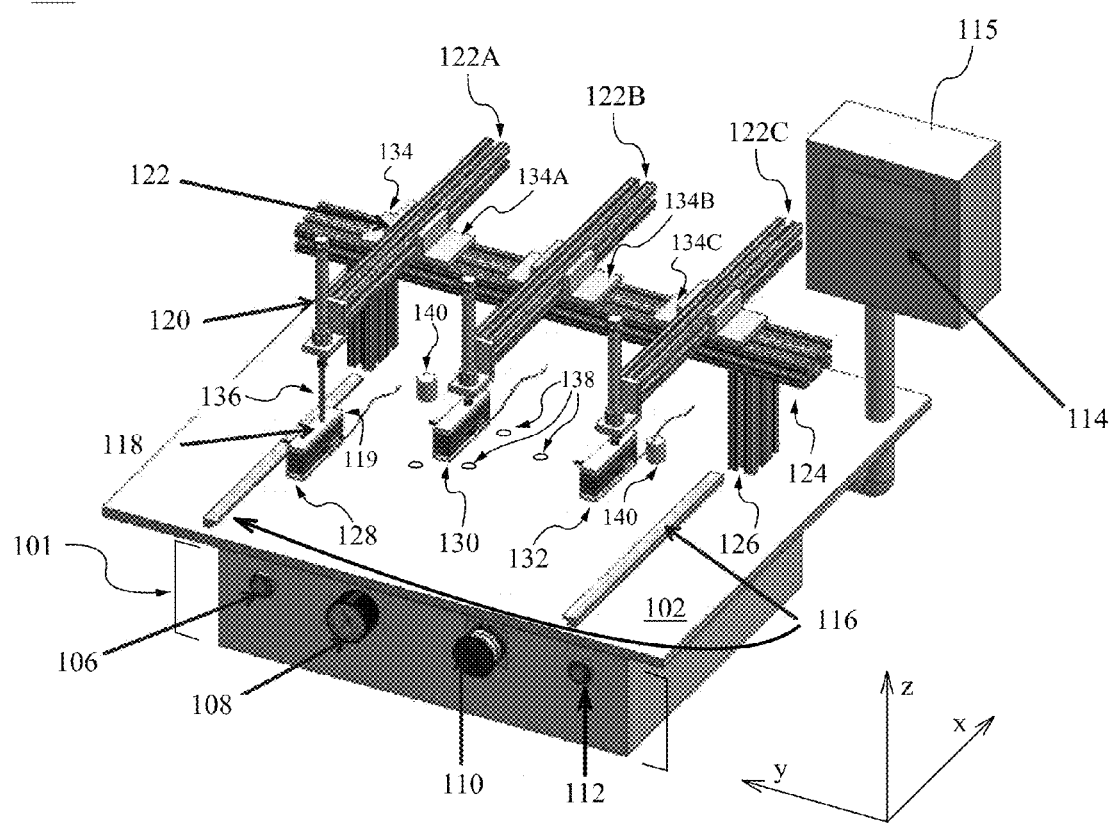
FIG. 1 illustrates a heat sink assembling device in accordance with some embodiments of the present invention.

Methods of and devices for heat sink assembling are disclosed. FIG. 1 illustrates a heat sink assembling device 100 in accordance with some embodiments of this invention. The device 100 is able to heat up one or more heat sinks by a thermal head on the device 100. The device 100 is able to comprise one or more user-defined profiles for controlling the heat sink heating temperature, such as a pre-selected temperature (e.g., 65° C.) or a temperature range (e.g., 50° C.-85° C.). When a user-define profile cycle is completed, the device 100 is able to stop automatically and wait for the next user-define cycle to automatically start again. In some embodiments, the device 100 is able to be controlled to function and stop based on various factors, such as a pre-defined time period, machine temperature, or an instruction or signal from a sensing/commending device. In some embodiments, the device 100 comprises one or more thermal heads 118. The positions (horizontal and/or vertical positions) of the thermal heads 118 are able to be adjusted. In some embodiments, the thermal heads 118 are able to be instantly attached to and detached from the device 100. In some other embodiments, additional thermal heads 118 are able to be added such that the device 100 is able to be expanded based on the manufacturing needs.

In some embodiments, the device 100 comprises a programmable logic controller (PLC Control) 115. The temperature and positions of the one or more thermal heads 118 are able to be controlled by the PLC Control 115. In some embodiments, the device 100 contains a user defined idle timer via PLC 115, such that the device 100 is able to be automatically turned off when the device 100 is idle for a pre-determined time. The PLC controller 115 is able to convert an analog thermal couple reading into a digital format, such that the PLC Controller 115 is able to compute the thermal and positional data received and adjust the temperature and positions of the thermal heads 118 and one or more pneumatic systems 120 based on the data received/computed or based on the settings in the user-defined profile.

In some embodiments, the device 100 comprises an assembly platform 102. A human operator interface (HMI Interface) 114 is able to electronically and/or mechanically couple with the assembly platform 102 for receiving the input, setup, and control of the user-defined profiles and/or controlling parameters, such that each of the thermal heads 118 are able to be independently and/or concurrently controlled to perform the functions that are assigned. The HMI Interface 114 is also able to display the status of the assembly platform 102, such as the actual temperature of the thermal heads 118, via one or more of thermal sensors/readers 119 on the thermal head 118, such that the users and the computer system of the device 100 are able to respond according to the data received and displayed on the HMI Interface 114.

The platform 102 is able to comprise one or more of the controllers 101, such as a start button 106, a pressure regulator 108, and emergency switch 110. The start button 106 is able to be used to start the device 100 when the start button 106 is pressed at the first time and to shut off the device 100 when the start button 106 is pressed the second time. The pressure regulator 108 is able to be used to control the pressure applied on the pneumatic pressing heads (e.g. the thermal heads 118). In some embodiments, the pressure regulator 108 comprises a turning knob. A rotational motion of the knob of the pressure regulator 108 can be a control of the pressure applied. The emergency switch 110 is able to be used to instantly or with a pre-defined delay time to shut down the power at the occurrence of an emergency event, such as an earthquake. A programable button 112 is able to be programed for a function desired. For example, a user is able to program the programable button 112 to be a controller of an auto-stop function such that the device 100 is able to automatically stop after all external weights are removed from the platform 102. The device 100 can comprise fixture rails 116. The fixture rails are able to be positioned on any locations on the platform 102 and shaped in any shape such that a PCB board/an electronic board is able to be immobilized on the platform 102. In some embodiments, the fixture rails 116 comprises two C-shape rails (the openings of the two C-shape rails are facing toward each other allowing the electronic board to be slid in and out along the Y-axis direction of the platform 102, such that a risk of damaging the thermal heads 118 can be avoided.

The device 100 is able to comprise one or more thermal heads 118. In some embodiments, the device 100 comprises three thermal heads 128, 130, 132. Each of the thermal heads 128, 130, 132 is able to be programed and operated independently and/or concurrently. In some embodiments, the device 100 comprises 4 thermal heads 118. In other embodiments, the device 100 comprises 16 thermal heads 118. A person of ordinary skill in the art appreciates that any numbers of the thermal heads are applicable. For example, the surface area of the platform 102 is able to be expanded according to the size of the electronic board to be applied and the number of the thermal heads can be selected base on the efficiency, costs, and the production rate needed.

In some embodiments, the device 100 comprises adjustable arms 122 that holds and positions the thermal heads 118. In some embodiments, the arms 122 are placed on the x-bar 124 and z-bar 126. The z-bar 126, extending along the Z-axis, supports the x-bar 124. In some embodiments, the x-bar 124 comprises a rail/slot structure, such that the arm 122 that is immobilized on the clamp 134 is able to be moved along the X-axis on the platform 102 by having the clamp 134 sliding along the X-axis on the rail of the x-bar 124. In some embodiments, the arm 122 is movable/extendable along the Y-axis on the clamp 134. With the ability to adjust the position of the thermal heads 118 in both the X-axis and Y-axis, the thermal heads 118 are able to be positioned in any location on the platform 102. In some other embodiments, the arms 122 are fixed/immobilized in pre-determined locations on the platform for the needs of high speed and repetitive production operations.

In some embodiments, the device 100 comprises a pneumatic cylinder 120. The pneumatic cylinder can comprise an extendable arm 136 fitting inside the pneumatic cylinder 120. The extendable arm 136 is able to extend out and retract back along the Z-axis, such that when the pneumatic cylinder 120 is actuated, the thermal head coupled with the extendable arm 136 is able to extend and move along the Z-axis direction until the thermal head is in a thermal/physical contact with a heat sink.

In some embodiments, a user enters a pre-selected manufacturing profile via the HMI Interface 114. The HMI Interface 114 with its computing, storing, and displaying components are able to perform according to the pre-selected/defined manufacturing profile. For example, a user is able to enter the heating temperature and pressing duration (i.e., 2 minutes) of the thermal head 118.

In an exemplary example, a PCB board is slid into the fixture rails 116 to be fixed in place on the platform 102. The first thermal head 128 is configured to be heated to 65° C. for 30 seconds after that the first thermal head 128 is in contact with a first heat sink. A second thermal head 130 is configured to be pre-heated to 75° C. and cooled to 60° C. before bringing it to be in contact with a second heat sink. A person of ordinary skill in the art appreciates that any executing orders, heating temperatures, pressing durations, waiting durations, and heating durations are within the scope of the present invention. After the completion of the pre-defined manufacturing process, the PCB board is removed and slid out from the fixture rails 116.

In some embodiments, the device 100 comprises a SMC pneumatic pressing head with a heating cartridge controlled by the PLC. The temperature control of the device 100 is able to be a proportional integral derivative (PID) controller. A user can define a manufacturing profile on the HMI Interface 114 on a touch screen. The thermal head 118 can comprise a pressing function having a pressing pressure controlled by a pressure regulator 108. The adjustment of the positions of the arms 122 can be done manually. In some other embodiments, the adjustment of the arms 122 is able to be done by a computer controlled robot, which can automate every step described above.

Each of the thermal heads 118 is able to be independently controlled and heated up to a predetermined different or same temperature. A solid state relay is able to be used to control a heat up the thermal head. In some embodiments, the device 100 comprises raised standoffs 138 that are mounted on the platform 102 as supports to the electronic board. In some embodiments, the standoff 138 are placed under the heat sink assembling area to provide support. A person of ordinary skill in the art appreciates that any numbers of the standoffs 138 are able to be placed at any location on the platform 102 to account for the shapes of the electronic board and the numbers/locations of the heat sinks. In some embodiments, the device 100 comprises one or more location pins 140, which can serve as electronics board stoppers and/or as location pins. In an example, two location pins 140 are used to immobilize the electronic board to ensure the board stays on the platform 102.

Figure 2:
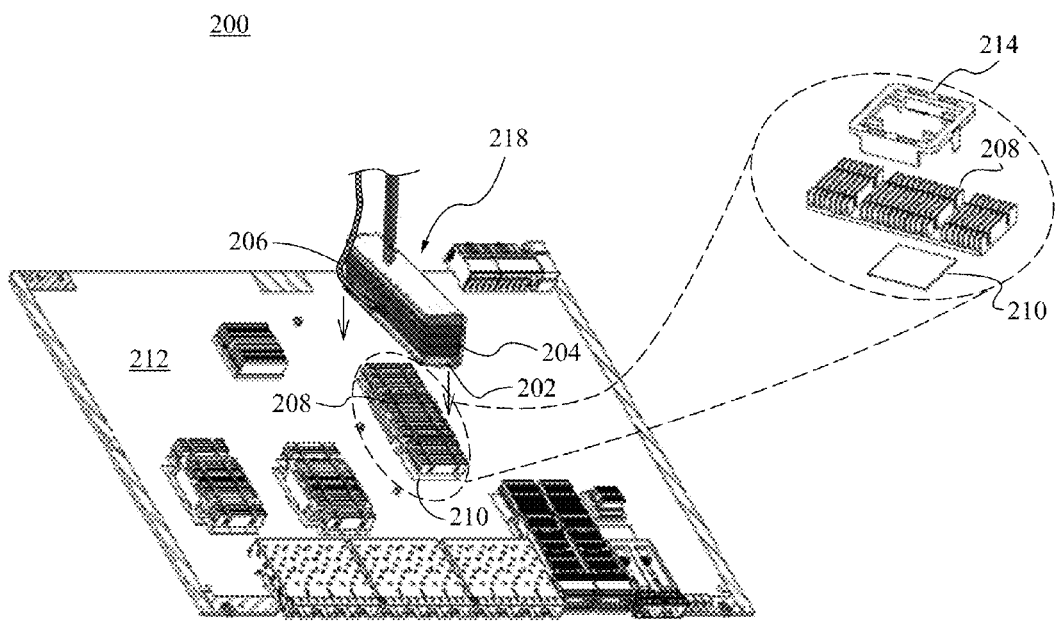
FIG. 2 illustrates the heat sink assembling apparatus in use in accordance with some embodiments of the present invention.

FIG. 2 illustrates the heat sink assembling apparatus 200 in use in accordance with some embodiments. The thermal head 218 can comprise a heating unit 202, an insulation part 204, and a thermal couple 206. The heating unit 202 is able to contain a 70 Å silicon rubber pad to provide a good heat transfer property to mitigate the uneven fin height on the heater. The thermal head 218 can be similar in its functions and shapes to the thermal head 118 (FIG. 1). The thermal head 218 is able to heat up the heat sink 208 and the phase change thermal pad 210, such that the heat sink 208 is able to attach/glue on the electronic board 212 for better thermal transfer. In some embodiments, the snap clip 214 can be added on the heat sink by using the press force generated by the thermal head 218.

Figure 3A:
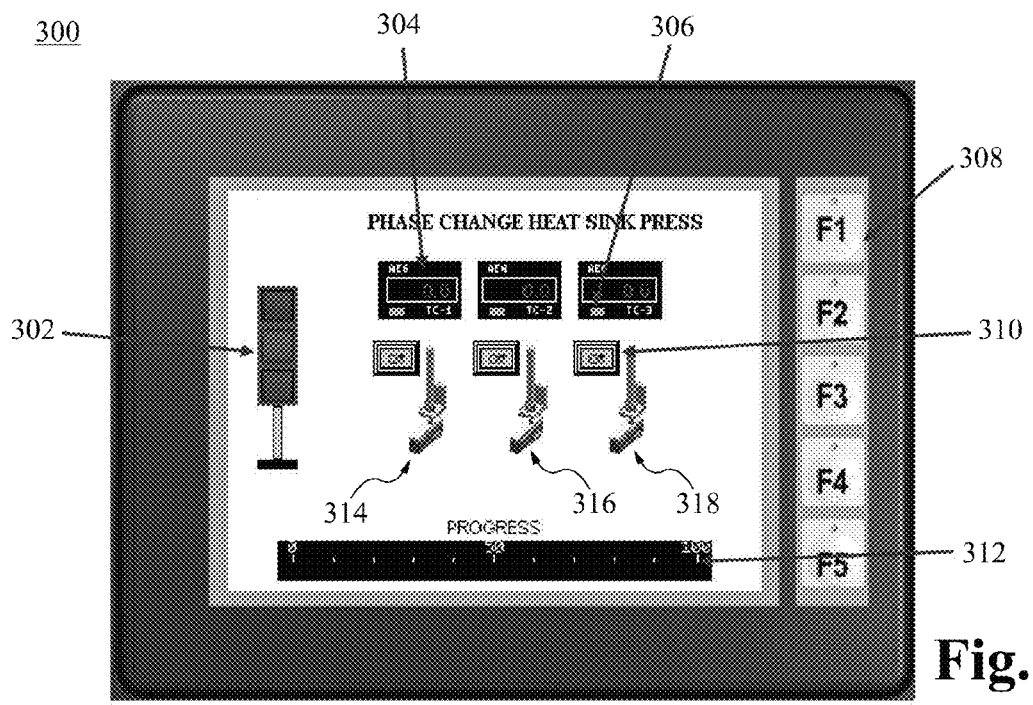
FIGS. 3A-3H illustrate an operational mode of the device in accordance with some embodiments of the present invention.

The operational modes of the HMI Interface 114 (FIG. 1) in accordance with some embodiments are now disclosed. FIGS. 3A-3H illustrate the operational modes of the device 100 (FIG. 1) in accordance with some embodiments of the present invention. Referring to FIG. 3A, a HMI interface 300 comprises a tower lighting 302, a temperature reading 304, a heater indicator 306, a function switch panel 308, a thermal head enabling button 310, and a working progress indicator 312. The device 100 (FIG. 1) is able to be started by a user using their finger to touch the thermal head enabling button 310 on the screen (HMI interface 300) to select and enable the corresponding thermal heads (such as the thermal head 128 of FIG. 1) to be heated. As shown in FIG. 3A, all three thermal head buttons 314, 316, and 318 are "Off." After a user touches the icon of the thermal head enabling button 310 (FIG. 3B), the icon 314 turns to "On" status while the icons 316 and 318 are still "OFF." After turning the thermal head 128 (FIG. 1) on by touching the icon 314, waiting the tower lighting 302 to turn green to proceed to the next step. The tower light indicates the readiness of the device 100 (FIG. 1). Next, the electronic board, thermal pad, and one or more heat sinks are loaded onto the platform 102 (FIG. 1). The assembling process can be continued by pressing the start button 106 (FIG. 1).

Figure 3B:
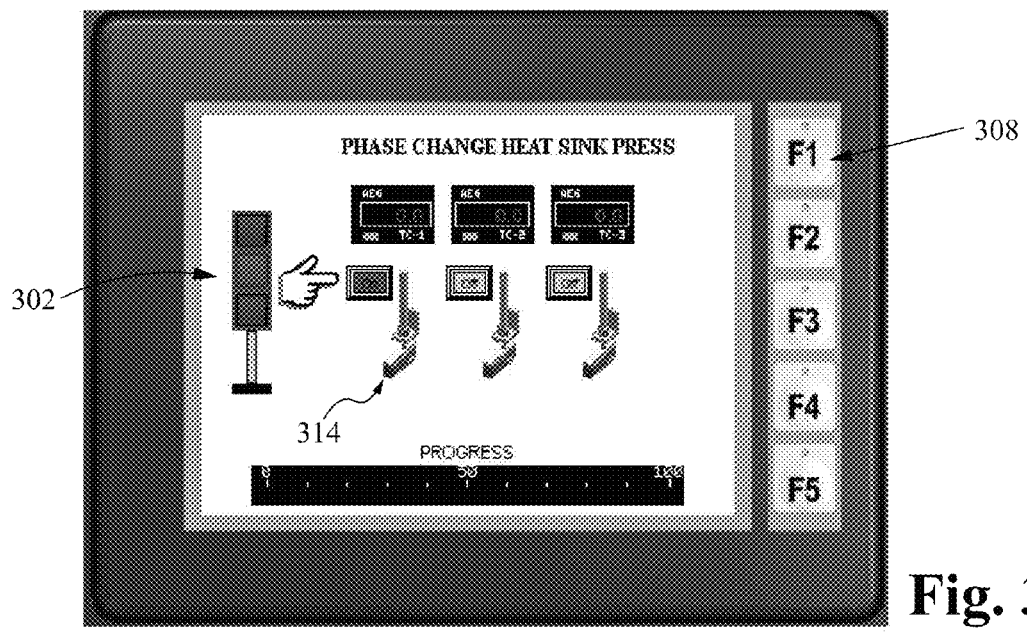

The operation of the engineering setup menu in accordance with some embodiments of the present invention is now disclosed. Referring to FIG. 3B, operating profiles can be input by pressing the Function Switch 308. After pressing any or one of the Function Switches 308, an "ENGINEERING SET UP MENU" 317 (FIG. 3C) pops up to the HMI interface 300. Items to be selected including (1) Manual Cylinder Control 320, (2) Profile Setting 322, (3) Idle Timer 324, (4) Reset 326, and a Return button 328. As shown in FIG. 3D, when "(1) Manual Cylinder Control" 320 is selected in FIG. 3C, a "Manual Cylinder Control" menu 319 is prompted. In some embodiments, the "Manual Cylinder Control" 319 comprises a specific cylinder control selection menu 330, which comprises icons of cylinders 338, 340, 342 corresponding to the respective pneumatic cylinders 120 with respective thermal heads 128, 130, 132 (FIG. 1) to be controlled. For example, when the "Cylinder 2" 340 on the specific cylinder control selection menu 330 is selected, a user is able to move the associated thermal head 130 via the corresponding pneumatic cylinders 120 (FIG. 1). Accordingly, a user is able to raise the thermal head 130 by pressing the "Cylinder Up" button 332 and lower the thermal head 130 by pressing the "Cylinder Down" button 334 for cylinder alignment check.

The Up and Down motion of the thermal heads 118 can be achieved by screwing or unscrewing on the supporting ream of the pneumatic cylinder 120. To return to the main screen, "Return Button" 336 is able to be pressed. A person of ordinary skill in the art appreciates that any buttons described herein can be pressed more than once to perform an action repeatedly. A person of ordinary skill in the art also appreciates that a long-pressing motion or hold on the button is able to equate to a repeating and/or continuous input of the same command order. In some embodiments, a sensor (not shown) is able to be installed in each of the thermal head 118 (FIG. 1). The sensor is able to sense/measure the pressing force of the thermal head 118 against the heat sink, such that the device 100 is able to be configured to automatically stop lowering the thermal heads 118 when a contact of the thermal head with the heat sink is detected or when a pre-defined pressing pressure is detected.

Figure 3C:
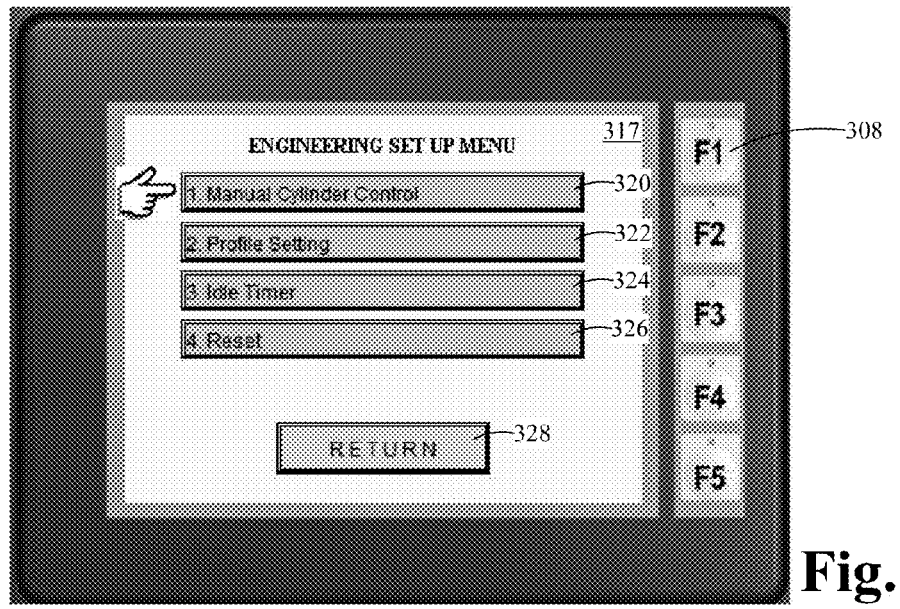
Figure 3D:
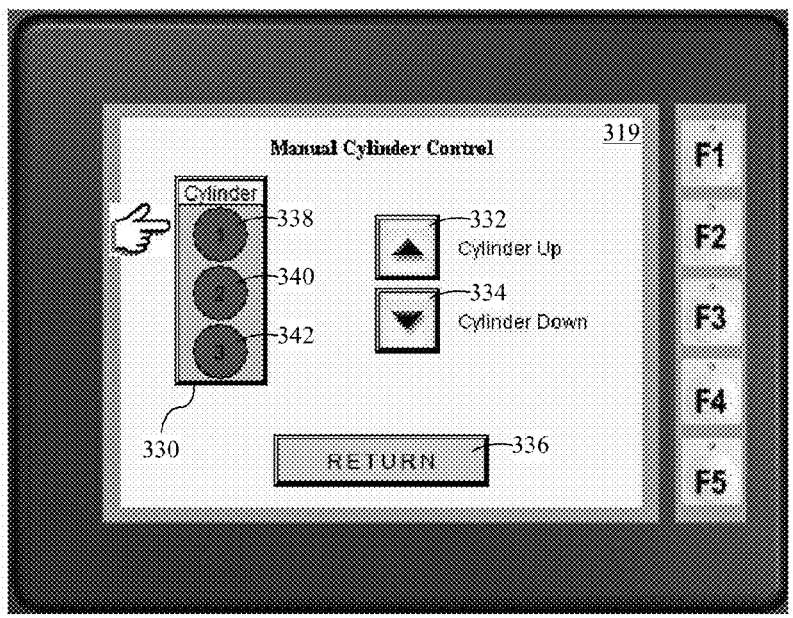
Figure 3E:
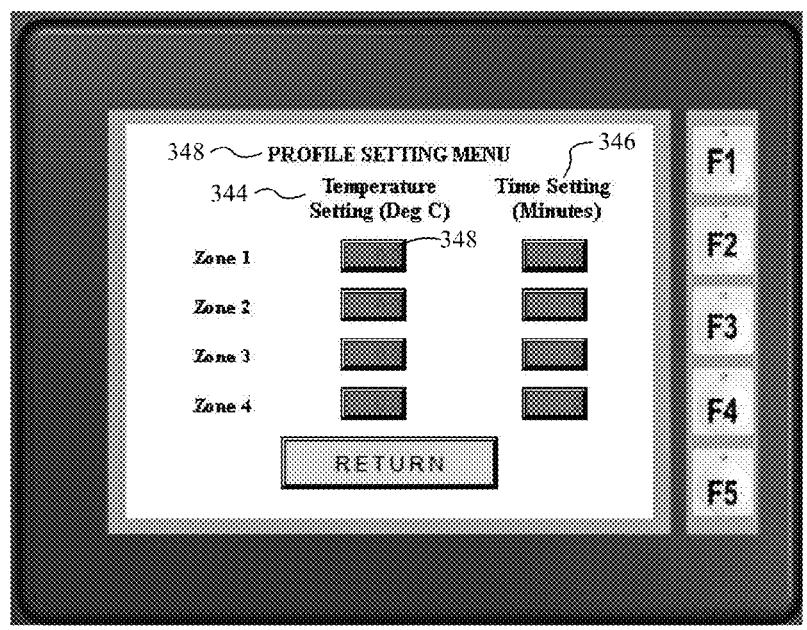
Figure 3F:
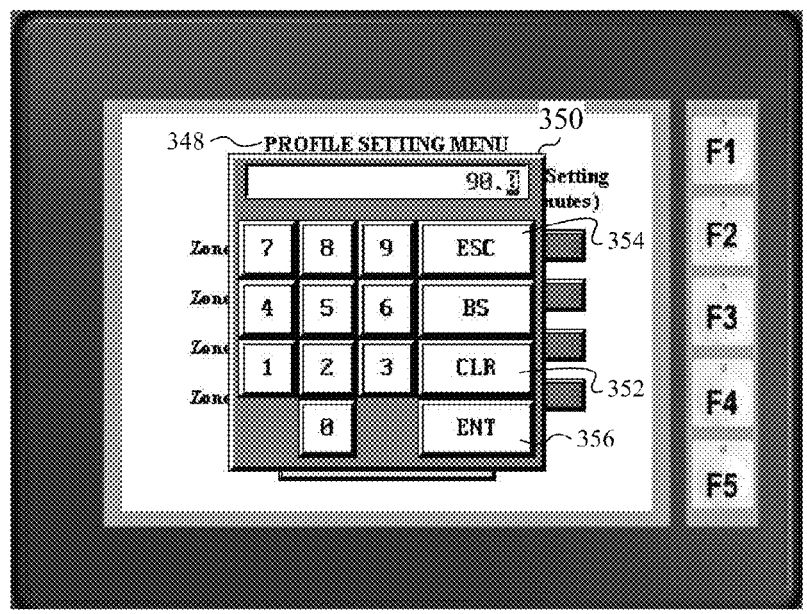

FIG. 3E illustrates the screen showing after that the "(2) Profile Setting" 322 of FIG. 3C is selected. The "Profile Setting Menu" 348 allows the heating temperature of the thermal heads to be defined. In some embodiments, four temperature zones are able to be defined. As shown in the "Temperature Setting (Deg C)" 344, four different temperatures are able to be entered with inputs of pre-determined "Time Settings (Minutes)" 346, such that a pre-defined temperature is able to performed with the duration selected. For example, the press of the Zone 348 button defines the temperature of the first Zone 348. The HMI interface 300 can prompt a temperature setting box 350 on top of the "Profile Setting Menu" 348. To set the temperature, "CLR" 352 is pressed and a pre-selected temperature is entered. Similar setting is able to be applied to the setting for heating durations by tapping the buttons 346 and repeating the above actions. After completing the Profile Setting, "Return" 328 (FIG. 3C) is pressed to return to the prior screen.

Figure 3G:
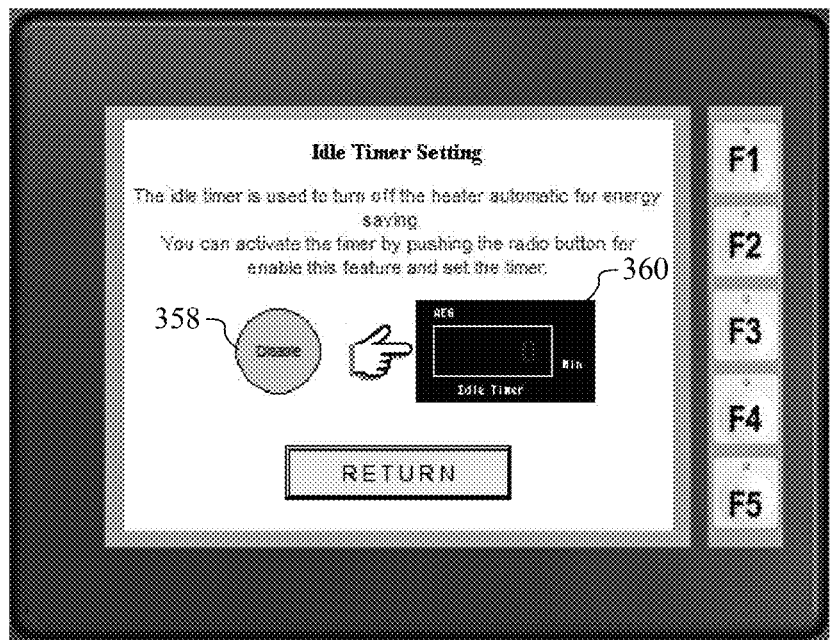
Figure 3H:
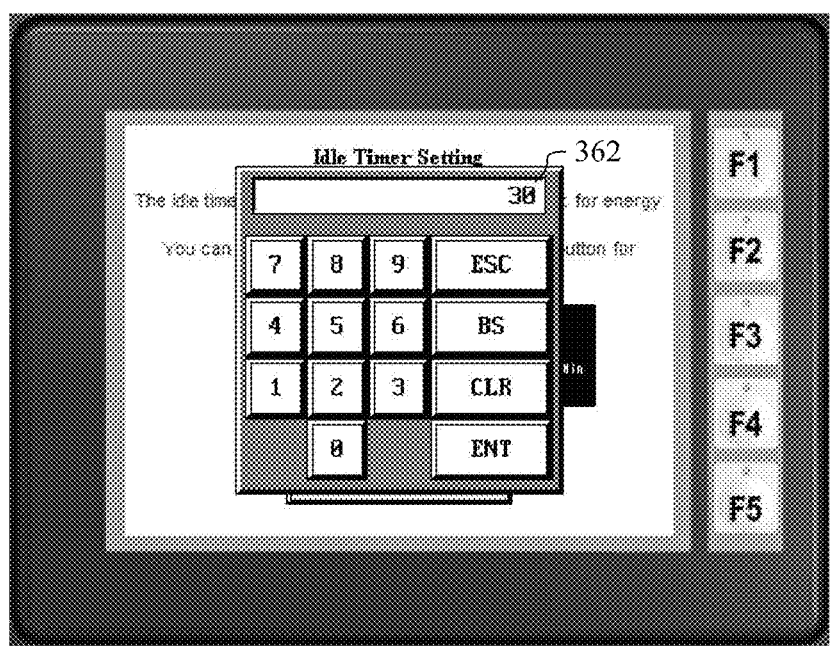

Next, the setting of "(3) Idle Timer" 324 is illustrated in the FIG. 3G. The idle timer can be used to save the energy and automatically shut down the heater when the system is not operating for a pre-defined time. Similar to the process described above, "(3) Idle Timer" 324 (FIG. 3C) is able to be selected. As shown in FIG. 3G, the Idle Timer 324 is able to be enabled by pressing the button 358 and to be enabled by pressing the timer box 360. When the timer box 360 is pressed, a time setting box 362 is popped up as shown in the FIG. 3H, such that an idle time is able to be defined. The machine is able to automatically turn to the mode of stand-by or shut-off when it is not functioning for the pre-defined duration. The "(4) Reset" 326 (FIG. 3C) can be pressed when the system is in a malfunction mode, so that the setting stored can be cleared and re-entered.

Figure 4:
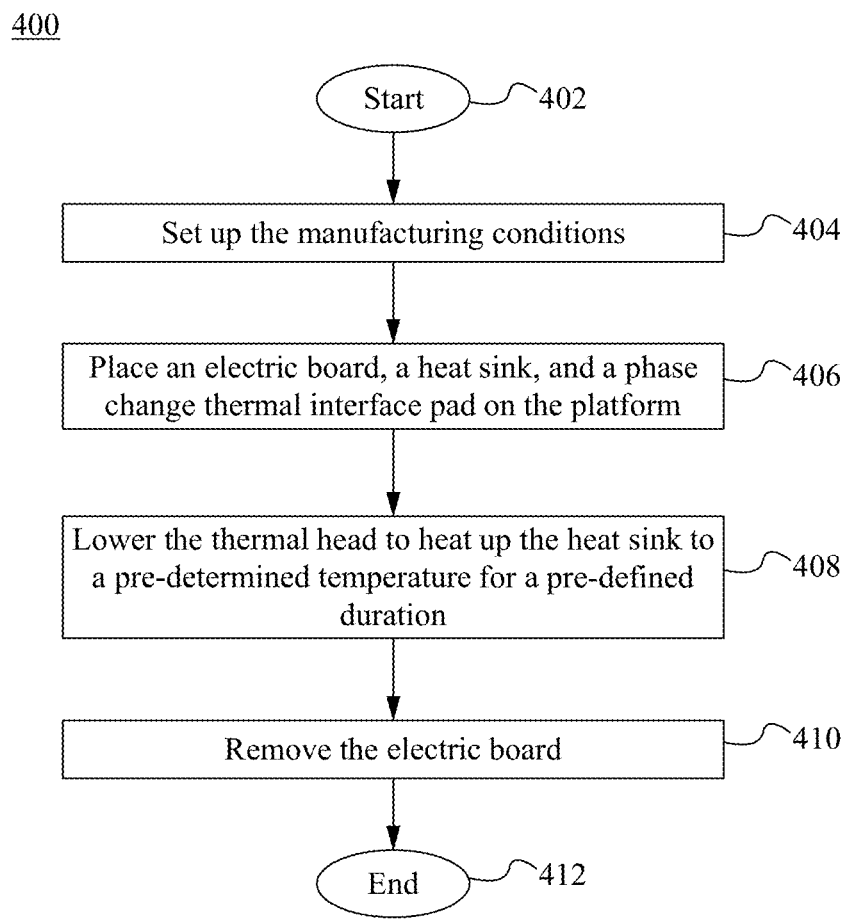
FIG. 4 illustrates a heat sink assembling method in accordance with some embodiments of the present invention.

FIG. 4 illustrates a heat sink assembly method 400 in accordance with some embodiments of the present invention. The method 400 is able to start from a Step 402. At a Step 404, the manufacturing conditions (such as temperature of the thermal head and pressing/heating duration) for the heat sink assembly are inputted at the HMI Interface. The setup process of the manufacturing profile is able to be the same/similar process described in the FIGS. 3A-3H and their associated texts. At a Step 406, an electronic board (such as PCB board), a heat sink, and a phase thermal interface pad are placed on the platform. In some embodiments, the thermal pad comprises Chromeric T777 Phase Change Thermal Interface Pads. At a Step 408, the thermal heads can be lowered to be in contact with the heat sink, such that the heat sink and the thermal pad are able to be heated to a pre-determined temperature range, such as 65° C.-70° C., for a pre-determined duration, such as 30 seconds-1 minute. At a Step 410, the electronic board with assembled heat sink is removed from the platform of the assembly device. The method 400 can stop at the Step 412.

The devices for and method of the heat sink assembly can be utilized to efficiently assemble heat sinks to an electronic board with a benefit of saving energy by heating only the heat sink and the thermal pad without heating the whole electronic board.

In operation, the manufacturing profile can be entered through the HMI interface. One or more thermal heads can be positioned vertically and/or horizontally to be in contact (thermally, physically, and/or electronically) with the heat sink, thermal pad, and the electronic board. The thermal head can be controlled by the manufacturing profile to heat up only the heat sink and thermal pad, such that the heat sink is able to be attached to the electronic board.

The present invention has been described in terms of specific embodiments incorporating details to facilitate the understanding of the principles of construction and operation of the invention. The specific configurations shown in relation to the various modules and the interconnections therebetween are for exemplary purposes only. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. An apparatus for heat sink assembly comprising:
   a. a movable thermal head; and
   b. a user control unit configured to control the thermal head to mount a heat sink to a circuit board.

2. The apparatus of claim 1, wherein the thermal head mechanically couples with a pneumatic cylinder, such that the thermal head is able to move in a vertical direction.

3. The apparatus of claim 1, wherein the thermal head comprises a heating element, a thermal insulation element, or a combination thereof.

4. The apparatus of claim 1, wherein the user control unit comprises a graphical user interface.

5. The apparatus of claim 1, wherein the user control unit is able to control the temperature of the thermal head to be maintained at a user defined temperature.

6. The apparatus of claim 1, wherein the user control unit is able to control a heating duration of the thermal head when the thermal head is in contact with the heat sink.

7. The apparatus of claim 1, further comprising an assembly platform.

8. The apparatus of claim 7, wherein the thermal head is configured to move in a direction perpendicular to the surface of the assembly platform.

9. The apparatus of claim 7, wherein the assembly platform comprises a thermal head holding structure.

10. The apparatus of claim 9, wherein the thermal head holding structure allows the thermal head to be positioned in substantially all of the locations on the surface of the assembly platform.

11. The apparatus of claim 9, wherein the thermal head holding structure comprises an adjustable arm configured to move the thermal head in a first direction.

12. The apparatus of claim 11, wherein the thermal head holding structure comprises a support structure supporting the adjustable arm allowing the adjustable arm to move in a second direction perpendicular to the first direction.

13. The apparatus of claim 7, wherein the assembly platform comprises one or more start buttons.

14. The apparatus of claim 7, wherein the assembly platform comprises a pressure regulator.

15. The apparatus of claim 7, wherein the assembly platform comprises a pressure gauge.

16. The apparatus of claim 7, wherein the assembly platform comprises an emergency shut-off switch.

* * * * *